US009314819B2

(12) United States Patent
Willson et al.

(10) Patent No.: US 9,314,819 B2
(45) Date of Patent: *Apr. 19, 2016

(54) ANHYDRIDE COPOLYMER TOP COATS FOR ORIENTATION CONTROL OF THIN FILM BLOCK COPOLYMERS

(71) Applicant: Board of Regents, The University of Texas System, Austin, TX (US)

(72) Inventors: Carlton Grant Willson, Austin, TX (US); Christopher John Ellison, Austin, TX (US); Takehiro Seshimo, Austin, TX (US); Julia Cushen, Austin, TX (US); Christopher M Bates, Austin, TX (US); Leon Dean, Spokane, WA (US); Logan J Santos, Austin, TX (US); Erica L Rausch, Austin, TX (US); Michael Maher, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 120 days.

This patent is subject to a terminal disclaimer.

(21) Appl. No.: 13/922,011

(22) Filed: Jun. 19, 2013

(65) Prior Publication Data

US 2013/0344242 A1 Dec. 26, 2013

Related U.S. Application Data

(63) Continuation-in-part of application No. 13/761,918, filed on Feb. 7, 2013, now Pat. No. 9,157,008.

(60) Provisional application No. 61/597,327, filed on Feb. 10, 2012.

(51) Int. Cl.
| | | |
|---|---|---|
| *B05D 7/26* | (2006.01) | |
| *C09D 137/00* | (2006.01) | |
| *B05D 7/00* | (2006.01) | |
| *B05D 1/00* | (2006.01) | |
| *B05D 5/00* | (2006.01) | |
| *B81C 1/00* | (2006.01) | |
| *G03F 7/00* | (2006.01) | |
| *B82Y 10/00* | (2011.01) | |
| *B82Y 40/00* | (2011.01) | |

(52) U.S. Cl.
CPC *B05D 7/56* (2013.01); *B05D 1/005* (2013.01); *B05D 5/00* (2013.01); *B05D 7/52* (2013.01); *B81C 1/00031* (2013.01); *B82Y 10/00* (2013.01); *B82Y 40/00* (2013.01); *C09D 137/00* (2013.01); *G03F 7/0002* (2013.01); *B05D 2252/02* (2013.01); *B81C 2201/0149* (2013.01)

(58) Field of Classification Search
None
See application file for complete search history.

(56) References Cited

U.S. PATENT DOCUMENTS

| | | | | |
|---|---|---|---|---|
| 7,521,090 | B1 * | 4/2009 | Cheng et al. | 427/256 |
| 7,989,026 | B2 * | 8/2011 | Cheng et al. | 427/256 |
| 8,491,965 | B2 * | 7/2013 | Cheng et al. | 427/256 |
| 2009/0181171 | A1 | 7/2009 | Cheng et al. | 427/240 |
| 2010/0316849 | A1 | 12/2010 | Millward et al. | 428/195.1 |
| 2011/0147984 | A1 | 6/2011 | Cheng et al. | 427/259 |
| 2011/0186544 | A1 | 8/2011 | Endou et al. | 216/58 |

FOREIGN PATENT DOCUMENTS

| | | |
|---|---|---|
| CN | 101734610 A | 6/2010 |
| JP | 2010-115832 A | 5/2010 |
| WO | WO/2011/116223 | 9/2011 |
| WO | WO/2012/175343 | 12/2012 |

OTHER PUBLICATIONS

Bates, C. M. et al. (2011) "Polymeric Cross-Linked Surface Treatments for Controlling Block Copolymer Orientation in Thin Films," *Langmuir* 27(5), 2000-2006.
Bates, F. S. et al. (1990) "Block Copolymer Thermodynamics: Theory and Experiment," *Annual Review of Physical Chemistry* 41, 525-557.
Colburn, M. et al. (2000) "Step and flash imprint lithography for sub-100-nm patterning," *Proceedings of SPIE—The International Society for Optical Engineering* 3997, 453-457.
Gillham, J. K. (1986) "Formation and Properties of Thermosetting and High $T_g$ Polymeric Materials," *Polymer Engineering and Science* 26(20), 1429-1433.
Han, E. et al. (2009) "Perpendicular Orientation of Domains in Cylinder-Forming Block Copolymer Thick Films by Controlled Interfacial Interactions," *Macromolecules* 42(13), 4896-4901.
Kim, H.-C. et al. (2001) "A Route to Nanoscopic $SiO_2$ Posts via Block Copolymer Templates," *Advanced Materials* 13(11), 795-797.
Kim, H.-C. et al. (2009) "Block Copolymer Based Nanostructures: Materials, Processes, and Applications to Electronics," *Chemical Reviews* 110(1), 146-177.
Lammertink, R. G. H. et al. (2000) "Nanostructured Thin Films of Organic-Organometallic Block Copolymers: One-Step Lithography with Poly(ferrocenylsilanes) by Reactive Ion Etching," *Advanced Materials* 12(2), 98-103.
Li, M. et al. (2006) "Block copolymer patterns and templates," *Materials Today* 9(9), 30-39.

(Continued)

*Primary Examiner* — William Phillip Fletcher, III
(74) *Attorney, Agent, or Firm* — Medlen & Carroll, LLP

(57) ABSTRACT

The use of self-assembled block copolymer structures to produce advanced lithographic patterns relies on control of the orientation of these structures in thin films. In particular, orientation of cylinders and lamellae perpendicular to the plane of the block copolymer film is required for most applications. The preferred method to achieve orientation is by heating. The present invention involves the use of polarity-switching top coats to control block copolymer thin film orientation by heating. The top coats can be spin coated onto block copolymer thin films from polar casting solvents and they change composition upon thermal annealing to become "neutral". Top coats allow for the facile orientation control of block copolymers which would otherwise not be possible by heating alone.

46 Claims, 6 Drawing Sheets

(56) References Cited

OTHER PUBLICATIONS

Milner, S. T. (1991) "Polymer brushes," *Science 251*(4996), 905-914.

Nagarajan, S. et al. (2008) "An Efficient Route to Mesoporous Silica Films with Perpendicular Nanochannels," *Advanced Materials 20*(2), 246-251.

Niu, S. et al. (2003) "Stability of Order in Solvent-Annealed Block Copolymer Thin Films," *Macromolecules 36*(7), 2428-2440.

Park, M. et al. (1997) "Block Copolymer Lithography: Periodic Arrays of ~1011 Holes in 1 Square Centimeter," *Science 276*(5317), 1401-1404.

Ross, C. A. (2001) "Patterned Magnetic Recording Media," *Annual Review of Materials Research 31*(1), 203-238.

Ruiz, R. et al. (2008) "Density Multiplication and Improved Lithography by Directed Block Copolymer Assembly," *Science 321*(5891), 936-939.

Ryu, D. Y. et al. (2007) "Surface Modification with Cross-Linked Random Copolymers: Minimum Effective Thickness," *Macromolecules 40*(12), 4296-4300.

Walton, D. G. et al. (1994) "A Free Energy Model for Confined Diblock Copolymers," *Macromolecules 27*(21), 6225-6228.

Yang, X. et al. (2008) "Toward 1 Tdot/$in.^2$ nanoimprint lithography for magnetic bit-patterned media: Opportunities and challenges," *Journal of Vacuum Science& Technology B: Microelectronics and Nanometer Structures 26*(6), 2604-2610.

Zhao, B. et al. (2000) "Polymer brushes: surface-immobilized macromolecules," *Progress in Polymer Science 25*(5), 677-710.

PCT International Search Report of International Application No. PCT/US2013/025174 dated Jun. 6, 2013.

\* cited by examiner

ANHYDRIDE COPOLYMER TOP COATS FOR ORIENTATION CONTROL OF THIN FILM BLOCK COPOLYMERS

CROSS-REFERENCE TO RELATED APPLICATIONS

This continuation-in-part application claims the benefit of priority to application U.S. Ser. No. 13/761,918, which was filed on Feb. 7, 2013 and issued as U.S. Pat. No. 9,157,008 B2, which claims benefit of priority to Provisional Application U.S. Ser. No. 61/597,327, which was filed on Feb. 10, 2012, the disclosures of which are incorporated herein by reference.

FIELD OF THE INVENTION

The use of self-assembled block copolymers to produce advanced lithographic patterns relies on their orientation control in thin films. Top coats allow for orientation of block copolymers by thermal annealing, which would otherwise be quite challenging. The present invention involves the use of copolymer top coats that can be spin coated onto block copolymer thin films, and used to control the orientation of the block copolymer domains by heating and then removed. The top coats enable orientation of the domains in block copolymer thin films that will not orient by heating alone in the absence of the top coat.

BACKGROUND OF THE INVENTION

The self-assembly of diblock copolymers into well-defined structures with dimensions on the order of 5-100 nm is well known [1]. In order for these structures to be useful in many applications it is necessary to use them as thin films and to orient the block copolymer structures such as lamellae and cylinders so that they are perpendicular to the substrate upon which they are coated. What is needed is a method to create features with the desired structural alignment that can be etched.

SUMMARY OF THE INVENTION

The invention comprises a polymer top coat that enables orientation of block copolymers in thin films by heating such that the phase separated structures orient perpendicular to the plane of the film that could not otherwise be oriented only by heating. Furthermore, this top coat can be coated from solvents that do not dissolve or substantially swell any component of the block copolymer. Top coat polymers described in this invention undergo a change in properties upon heating that renders them effective in the orientation process. Furthermore, the top coat polymers of this invention can be removed from the surface of the block copolymer through use of a solvent that does not dissolve or substantially swell any component of the block copolymer.

In one embodiment, the invention relates to a method of applying a top coat to a block copolymer film to create a layered structure, comprising a substrate, a surface energy neutralization layer, a block copolymer, and a top coat composition that can be coated without damaging or modifying the block copolymer. The insoluble surface neutralization layer is created, by methods well known in the art and may consist of a Self Assembled Monolayers, "brushes," or crosslinked polymers. The block copolymer is typically applied on top of the insoluble neutralization layer by spin coating. In one embodiment, the top coat polymer is composed of a plurality of components, one of which is an anhydride. In one embodiment, the anhydride is derived from a maleic anhydride monomer moiety. The proportions of the components in the top coat can be varied to optimize the performance for a specific block copolymer. In one embodiment, the top coat composition is dissolved in a solvent that does not dissolve or substantially swell the block copolymer film. In one embodiment, the solvent may be water, an alcohol, or a mixture of water and alcohols. The solvent may be basic. In one embodiment, said base is an aqueous ammonium hydroxide or aqueous alkyl ammonium hydroxide or like derivatives of alkyl ammonium hydroxides. In one embodiment, the anhydride copolymer is dissolved in base and the resulting salt is isolated and redissolved in a new casting solvent. In one embodiment, the salt casting solvent is water, organic solvent, or mixtures of water and organic solvents. In another embodiment, the solvent is an alcohol or mixtures of alcohol and organic solvents.

In one embodiment, the invention relates to a method, comprising: a) providing a substrate having a surface, a surface neutralization layer, a block copolymer, and a top coat; b) treating said substrate surface with said surface neutralization layer under conditions such that a first layer is created; c) coating said surface neutralization layer with block copolymer under conditions such that a second layer on said surface is created comprising a block copolymer film, and d) coating said block copolymer with a top coat so as to create a third layer on said surface, wherein said third layer enables the orientation of the block copolymer domains perpendicular to the plane of the film by thermal annealing alone. In many applications it is desirable to achieve orientation simply by heating or so called thermal annealing. In one embodiment, the thermal annealing in the absence of the top coat layer does not produce perpendicular features. In one embodiment, the top coat of step d) is in a solvent or solvent mixture that will not damage, dissolve, or substantially swell the block copolymer. In one embodiment, the top coat of step d) is in a solvent that reacts with the top coat. In one embodiment, the top coat of step d) is in a solvent mixture, and the solvent mixture contains a component that reacts with the top coat. In one embodiment, the top coat is dissolved in a liquid comprised of at least one of the group consisting of water, alcohol, and organic solvent (or combinations thereof). In one embodiment, the top coat is dissolved in a liquid comprised of a mixture of any two or more of the group consisting of water, alcohol and organic solvent. In one embodiment, the liquid further contains a base. In one embodiment, the liquid is a base. In one embodiment, the base is an amine. In one embodiment, said amine is selected from the group consisting of an alkyl amine, aliphatic amine and an amine attached to any combination of functional groups (or combinations thereof). In one embodiment, said amine is a salt. In one embodiment, said salt has a cation selected from the group consisting of an ammonium cation, an alkyl ammonium cation and an aliphatic ammonium cation (or combinations thereof). In one embodiment, the salt comprises a combination of cations. In one embodiment, said salt comprises an anion. In one embodiment, said anion is an hydroxide anion. In one embodiment, said base comprises ammonium hydroxide. In one embodiment, said base comprises an alkyl ammonium hydroxide. In one embodiment, said base comprises trimethylamine. In one embodiment, said base comprises a mixture of a salt and an amine. In one embodiment, the reacted top coat is re-isolated. In one embodiment, the dissolved top coat is re-isolated. In one embodiment, the re-isolated top coat is used again in a method described above. In one embodiment, the top coat is re-isolated by one or more techniques selected from the group consisting of precipitation, evaporation and distillation (or combinations thereof). In one embodiment, the method further comprises after step d) thermal annealing. In one embodiment, the method further comprises removing said top coat from said block copolymer with stripping solvent that does not damage, dissolve, or significantly swell the block copolymer. In one embodiment, said top coat comprises an anhydride. In one embodiment, the anhydride derives from maleic anhydride. In one embodiment, the substrate is selected from the group consisting of silicon, silicon oxide, glass, surface-modified glass, plastic, ceramic, transparent substrates, flexible substrates, and substrates used in roll-to-roll processing (or combinations thereof). In one embodiment, said block copolymer is comprised of plurality of different blocks. In one embodiment, the block copolymer comprises at least one block that etches at a different rate than the other block(s). In one embodiment, the block copolymer comprises silicon in at least one block. In one embodiment, the block copolymer is poly(styrene-block-4-trimethylsilylstyrene-block-styrene). In one embodiment, the block copolymer is poly(4-trimethylsilylstyrene-block-D,L-lactide). In one embodiment, the block copolymer comprises tin in at least one block. In one embodiment, the block copolymer comprises an inorganic component. In one embodiment, the block copolymer comprises an organometallic component. In one embodiment, said thermal annealing creates block copolymer domains perpendicular to the plane of the film. In one embodiment, the morphology of the domains is selected from the group consisting of lamellar, spherical, and cylindrical. In one embodiment, said nanostructures are selected from the group consisting of: lamellae, cylinders, vertically aligned cylinders, horizontally alligned cylinders, spheres, gyroids, network structures, and hierarchical nanostructures. In one embodiment, said thermal annealing is performed under conditions selected from the group consisting of an air environment, an environment of inert gas, reduced pressure, and increased pressure. In one embodiment, said surface neutralization layer comprises components selected from the group consisting of crosslinked polymer, brushes, self-assembled monolayers, chemically modified surfaces, physically modified surfaces, and thermally cured surfaces (or combinations thereof).

In one embodiment, the invention contemplates a method, comprising: a) providing a substrate having a surface, a surface neutralization layer, a block copolymer, and a top coat; b) treating said substrate surface with said surface neutralization layer under conditions such that a first layer is created; c) coating said surface neutralization layer with block copolymer under conditions such that a second layer on said surface is created comprising a block copolymer film; and d) coating said block copolymer with a top coat so as to create a third layer on said surface; e) treating said third layer under conditions which enable the orientation of block copolymer features perpendicular to the plane of the film. In many applications it is desirable to achieve orientation simply by heating or so called thermal annealing. In one embodiment, said treating of step e) comprises thermal annealing. In one embodiment, thermal annealing in the absence of the top coat layer does not produce perpendicular features. In one embodiment, said top coat is dissolved in trimethylamine. In one embodiment, said coating comprises spin coating.

In one embodiment, the polymer salt is prepared by dissolving the anhydride polymer in liquid ammonia and then evaporating the solvent. In another embodiment, the salt is dissolved in a solution of ammonia or alkyl amine and the salt is isolated by precipitation or by evaporation of the solvent. In one embodiment, said base is trimethylamine. In many applications it is desirable to achieve orientation simply by heating or so called thermal annealing. In one embodiment, the invention further comprises: heating (thermal annealing) the layered structure under conditions such that nanostructures are formed. In one embodiment, the method to remove the top coat comprises: dissolution in a solvent or mixture of solvents that does not dissolve or substantially swell the block copolymer thin film layer. In one embodiment, said nanostructures comprise cylindrical structures, said cylindrical structures being substantially vertically oriented with respect to the plane of the film. In one embodiment, said nanostructures comprise lamellar (line-space) structures, said line structures being substantially vertically oriented with respect to the plane of the surface. It is not our intention to limit the invention based on the morphology of the block copolymer.

In one embodiment, the invention relates to a layered structure comprising first, second and third layers on a surface, wherein said first layer comprises a crosslinked polymer, wherein said second layer comprises a block copolymer film, and wherein said third layer comprises an anhydride. In one embodiment, said surface comprises silicon.

In one embodiment, said substrate is a silicon wafer. In one embodiment, said substrate is quartz. In one embodiment, said substrate is glass. In one embodiment, said substrate is plastic. In one embodiment, said substrate is a transparent substrate. In one embodiment, said substrate is a roll-to-roll substrate. In one embodiment, said substrate is coated with a substrate surface energy neutralizing layer with interfacial energy between that of two blocks. It is not our intention to limit the invention based on the substrate or the neutralizing layer that is employed. In one embodiment, the block copolymer is a diblock copolymer. In one embodiment, the block copolymer is a triblock copolymer. It is not our intention to limit the scope of the invention relative to the number of blocks in the block copolymer, the architecture/linkage of the blocks, or the morphology of the oriented structures that result from annealing nor is it our intention to limit the invention as to the chemical constituents of the block copolymer.

In one embodiment, the invention relates to a method of applying a top coat to a block copolymer film to create a layered structure, comprising multiple steps. For example, in one embodiment (shown in FIG. 3) 1) the surface treatment is dissolved in toluene and spin coated on the surface of a substrate (e.g. silicon wafer), 2) the surface treatment is crosslinked at 250° C. for 5 min, 3) and Washed with toluene 2 times. For the next layer, there is the step of 4) the Block copolymer is dissolved in toluene and spin coated. For the next layer, there is the step of 5) the top coat is dissolved in aqueous trimethylamine and spin coated; thereafter one can 6) Anneal the thin films at 190° C. for 1 minute. The annealing can be thermal annealing which orients nanofeatures; these nanofeatures can be revealed by 7) Stripping the top coat by spinning the water at 3000 rpm and applying 40 drops of aqueous trimethylamine followed by 10 drops of methanol. One can thereafter etch, for example, in one embodiment 8) Oxygen plasma etch was applied to the block copolymer with the following conditions: Pressure=20 mTorr, RF Power=10 W, ICP Power=50 W, $O_2$ flow rate=75 sccm, Argon flow-rate=75 sccm, temperature=15° C., time=30 seconds, as demonstrated in FIG. 3.

BRIEF DESCRIPTION OF THE DRAWINGS

For a more complete understanding of the features and advantages of the present invention, reference is now made to the detailed description of the invention along with the accompanying figures.

FIG. 1A) Poly(maleic anhydride) is not soluble in polar casting solvent and cannot be readily spin-coated onto block copolymer, FIG. 1B) when exposed to aqueous trimethylamine, the polymer is readily spin-coatable out of base, but now it has a high surface energy because it is very polar, FIG. 1C) with heat, the coat sets with the as trimethylamine and water leave, resulting in a lower surface energy. This enables perpendicular orientation of block copolymers.

FIG. 3A) The surface treatment is dissolved in toluene and spin-coated, then cross-linked at 250° C. for 5 minutes, then washed with toluene two times. FIG. 3B) The block copolymer is dissolved in toluene and spin coated. FIG. 3C) The top coat is dissolved in aqueous trimethylamine and spin coated. FIG. 3D) The thin films are annealed at 190° C. for 1 minute. FIG. 3E) The top coat is stripped by spinning the wafter at 3000 rpm and applying 40 drops of aqueous trimethylamine followed by 10 drops of methanol. FIG. 3F) The block copolymer is then oxygen plasma etched under the following conditions: Pressure=20 mTorr, RF Power=10 W, ICP Power=50 W, $O_2$ flow rate=75 sccm, Argon flowrate=75 sccm, temperature=15° C., time=30 seconds.

DEFINITIONS

Figure 1:
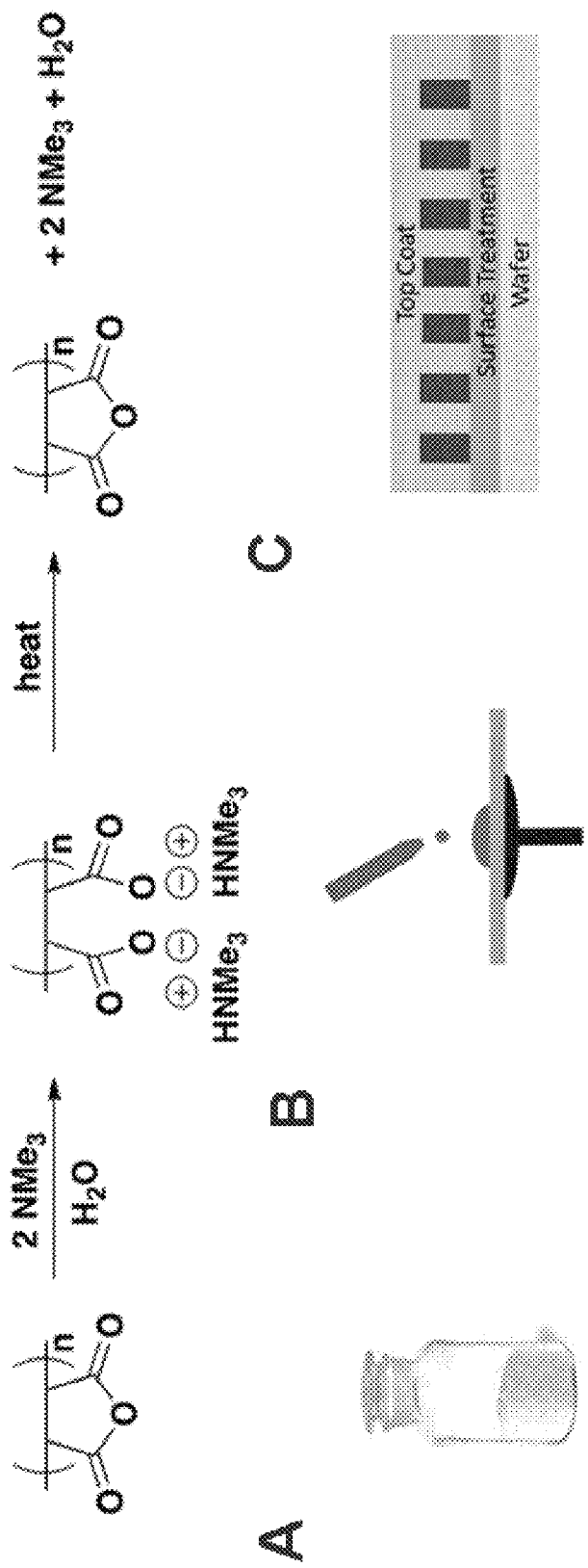
FIG. 1A-C illustrates a representative example of the top coat process showing the ring opening and closing reactions of one top coat polymer that incorporates an anhydride moiety derived from maleic anhydride that is reacted with trimethylamine.
Figure 2:
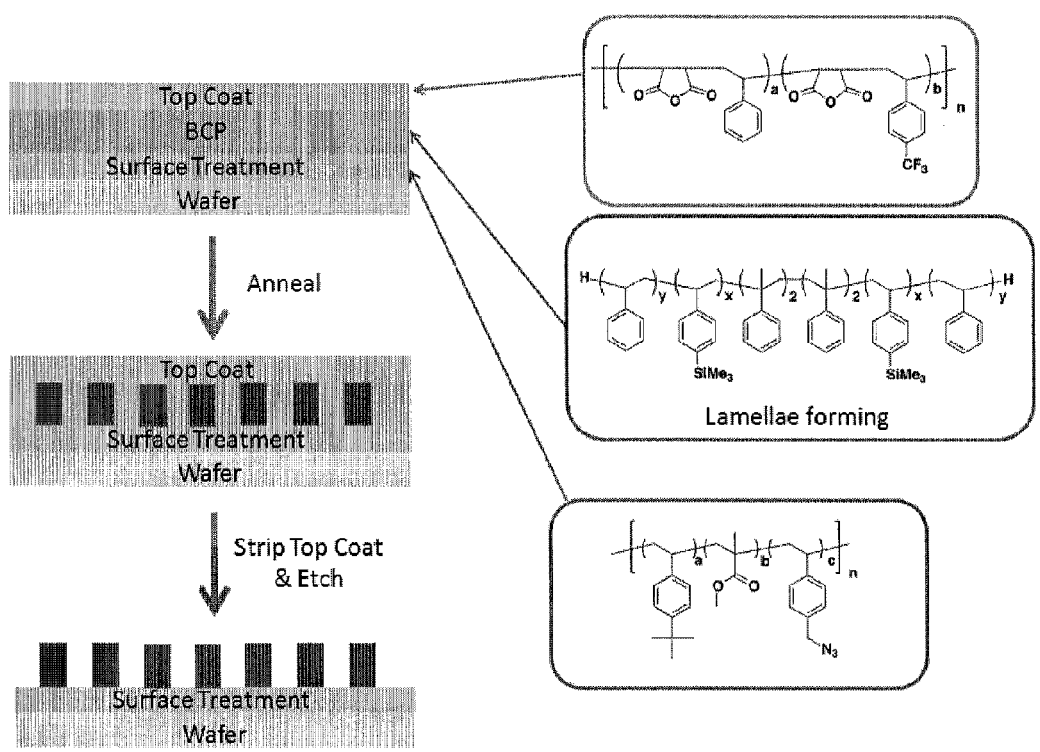
FIG. 2 shows a specific example of a representative film stack of materials amenable to the top coat invention disclosed herein.
Figure 3:
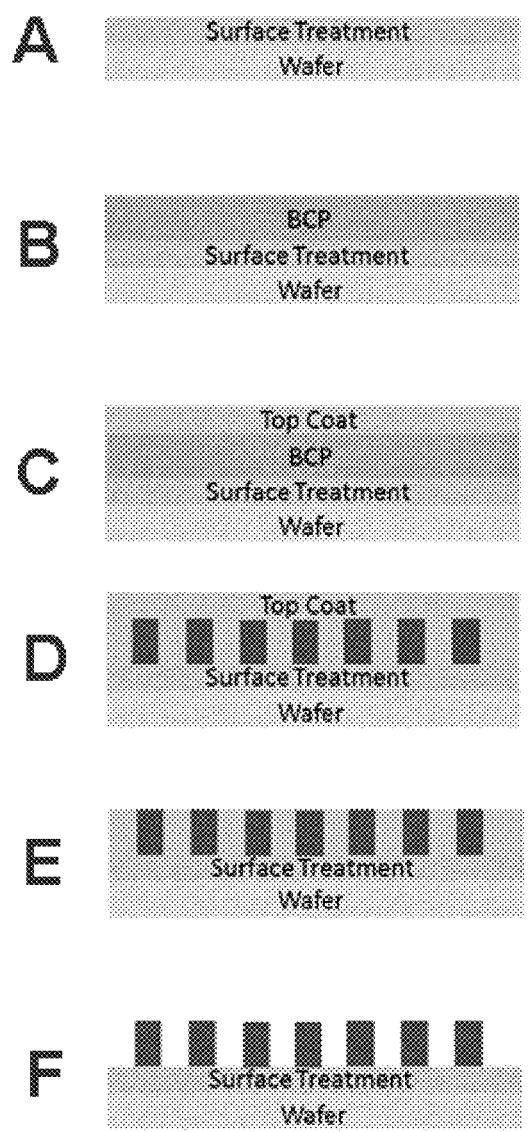
FIG. 3A-F illustrates one embodiment of the coating, annealing, and stripping process for a specific set of materials. The figure illustrates a representative experimental procedure of processing steps associated with the top coat invention disclosed herein.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

In addition, atoms making up the compounds of the present invention are intended to include all isotopic forms of such atoms. Isotopes, as used herein, include those atoms having the same atomic number but different mass numbers. By way of general example and without limitation, isotopes of hydrogen include tritium and deuterium, and isotopes of carbon include $^{13}C$ and $^{14}C$. Similarly, it is contemplated that one or more carbon atom(s) of a compound of the present invention may be replaced by a silicon atom(s). Furthermore, it is contemplated that one or more oxygen atom(s) of a compound of the present invention may be replaced by a sulfur or selenium atom(s).

As used herein "base" includes any entity that will react with the anhydride moiety.

As used herein "surface energy neutralization layer" is the same as the "substrate surface neutralization layer."

As used herein, brush polymers are a class of polymers that are adhered to a solid surface [2]. The polymer that is adhered to the solid substrate must be dense enough so that there is crowding among the polymers which then, forces the polymers to stretch away from the surface to avoid overlapping. [3]

In the field of electronic devices, roll-to-roll processing, also known as web processing, reel-to-reel processing or R2R, is the process of creating electronic devices on a roll of flexible plastic or metal foil. In other fields predating this use, it can refer to any process of applying coatings, printing, or performing other processes starting with a roll of a flexible material and re-reeling after the process to create an output roll. A thin-film solar cell (TFSC), also called a thin-film photovoltaic cell (TFPV), is a solar cell that is made by depositing one or more thin layers (thin film) of photovoltaic material on a substrate or surface. Possible roll-to-roll substrates include, but are not limited to metalized polyethylene terphthalate, metal film (steel), glass films (e.g. Corning Gorilla Glass), graphene coated films, polyethylene naphthalate (Dupont Teonex), and Kapton film, polymer films, metalized polymer films, glass or silicon, carbonized polymer films, glass or silicon. Possible polymer films include polyethylene terephthalate, kapton, mylar, etc.

As used herein, a block copolymer consists of two or more polymeric chains (blocks), which are chemically different and covalently attached to each other. Block copolymers are being suggested for many applications based primarily on their ability to form nanometer scale patterns. These self-assembled patterns are being considered as nanolithographic masks as well as templates for the further synthesis of inorganic or organic structures. Such applications are made possible by taking advantage of contrasts in chemical or physical properties that lead to different etch rates between each block. New applications in, for example, fuel cells, batteries, data storage and optoelectronic devices generally rely on the inherent properties of the blocks. All of these uses depend on the regular self-assembly and orientation of block copolymers over macroscopic distances.

4-trimethylsilylstyrene is an example of a styrene derivative. The monomer is represented by the following structure:

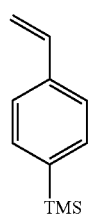

and abbreviated TMSS TMS-St. The corresponding polymeric structure is:

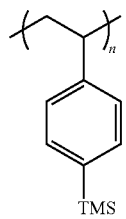

and is abbreviated PTMSS P(TMS-St).

Figure 4:
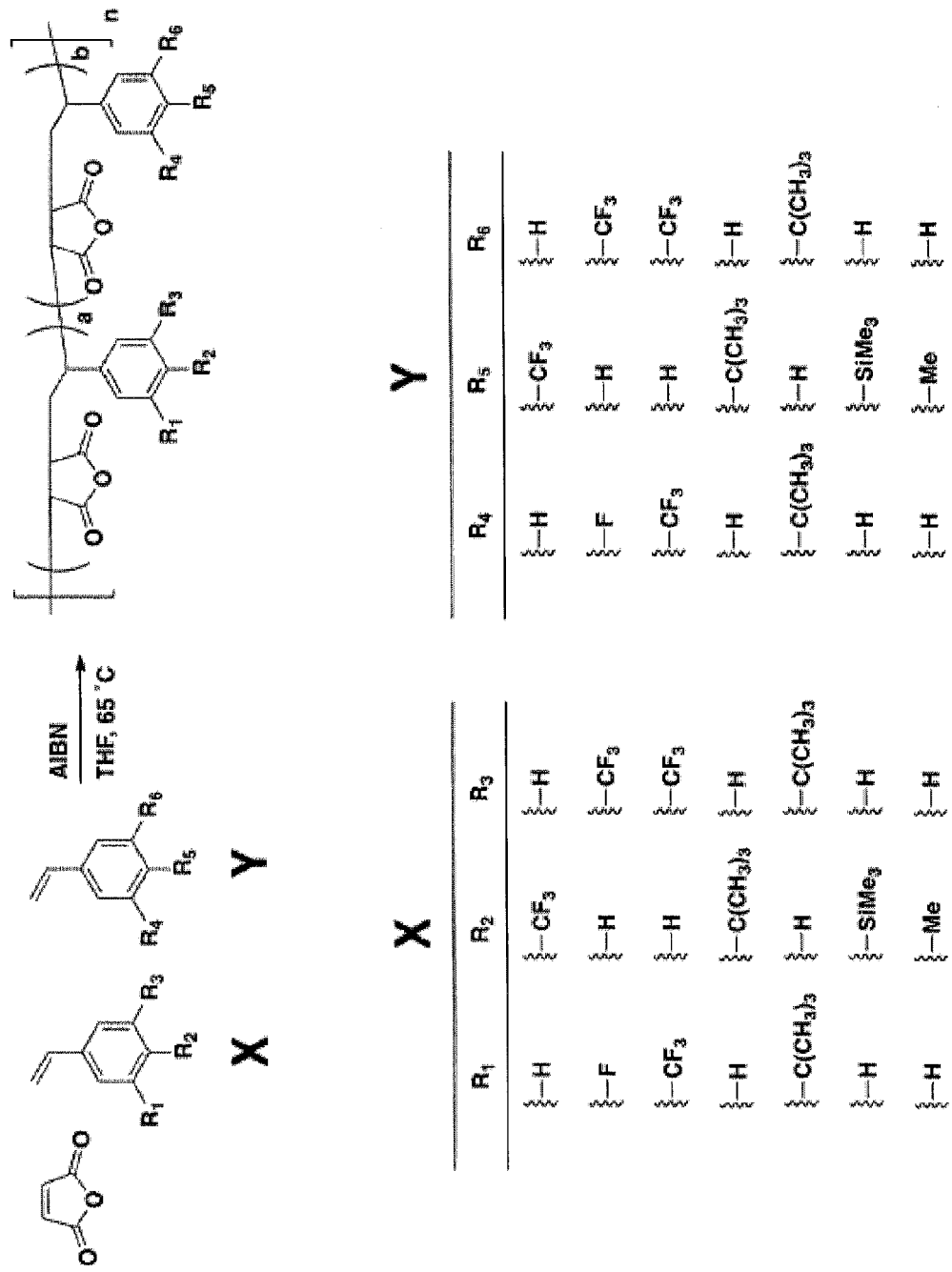
FIG. 4 provides non-limiting examples of top coat designs to demonstrate control of the relative composition of each component of the top coat copolymer.

The present invention also contemplates styrene "derivatives" where the basic styrene structure is modified, e.g. by adding substituents to the ring. Derivatives of any of the compounds shown in FIG. 4 can also be used. Derivatives can be, for example, hydroxy-derivatives or halo-derivatives. As used herein, "hydrogen" means —H; "hydroxy" means —OH; "oxo" means =O; "halo" means independently —F, —Cl, —Br or —I.

It is desired that the block copolymer be used to create "nanostructures" on a surface, or "physical features" with controlled orientation. These physical features have shapes and thicknesses. For example, various structures can be formed by components of a block copolymer, such as vertical lamellae, in-plane cylinders, and vertical cylinders, and may depend on film thickness, the surface energy neutralization layer, and the chemical properties of the blocks. In a preferred embodiment, the block copolymer domains are substantially vertically aligned with respect to the plane of the first film. Orientation of structures in regions or domains at the nanometer level (i.e. "microdomains" or "nanodomains") may be controlled to be approximately uniform, and the spatial arrangement of these structures may also be controlled. For example, in one embodiment, domain spacing of the nanostructures is approximately 50 nm or less. The methods described herein can generate structures with the desired size, shape, orientation, and periodicity. Thereafter, in one embodiment, these structures may be etched or otherwise further treated.

As noted, in one embodiment, the method involves annealing and preferably thermal annealing. It is not intended that the present invention be limited to only one type or method of annealing. In one embodiment, annealing comprises sonication. In one embodiment, annealing utilizes solvent. Importantly, it is desired that annealing effects rearrangement of the underlying block copolymer material.

DETAILED DESCRIPTION OF THE INVENTION

The present invention involves the use of copolymer top coats that can be spin coated onto block copolymer thin films, and used to control the orientation of the block copolymer domains (or features) by heating and then removed. The top coats enable orientation of the domains in block copolymer thin films that will not orient by heating alone in the absence of the top coat.

In one embodiment, the top coat layer is composed of various polymer components. In one embodiment, an anhydride is a constant component. In one embodiment, the top coat components are soluble in base. In one embodiment, the top coat is dissolved in trimethylamine. The use of trimethylamine has advantages, including the advantage of being able to work with a broad class of compounds.

In one embodiment, the invention contemplates stripping the top coat. In some embodiments, the top coat can be re-isolated and reused.

Thus, specific compositions and methods of anhydride copolymer top coats for orientation control of thin film block copolymers have been disclosed. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates, which may need to be independently confirmed.

EXAMPLE 1

Figure 5:
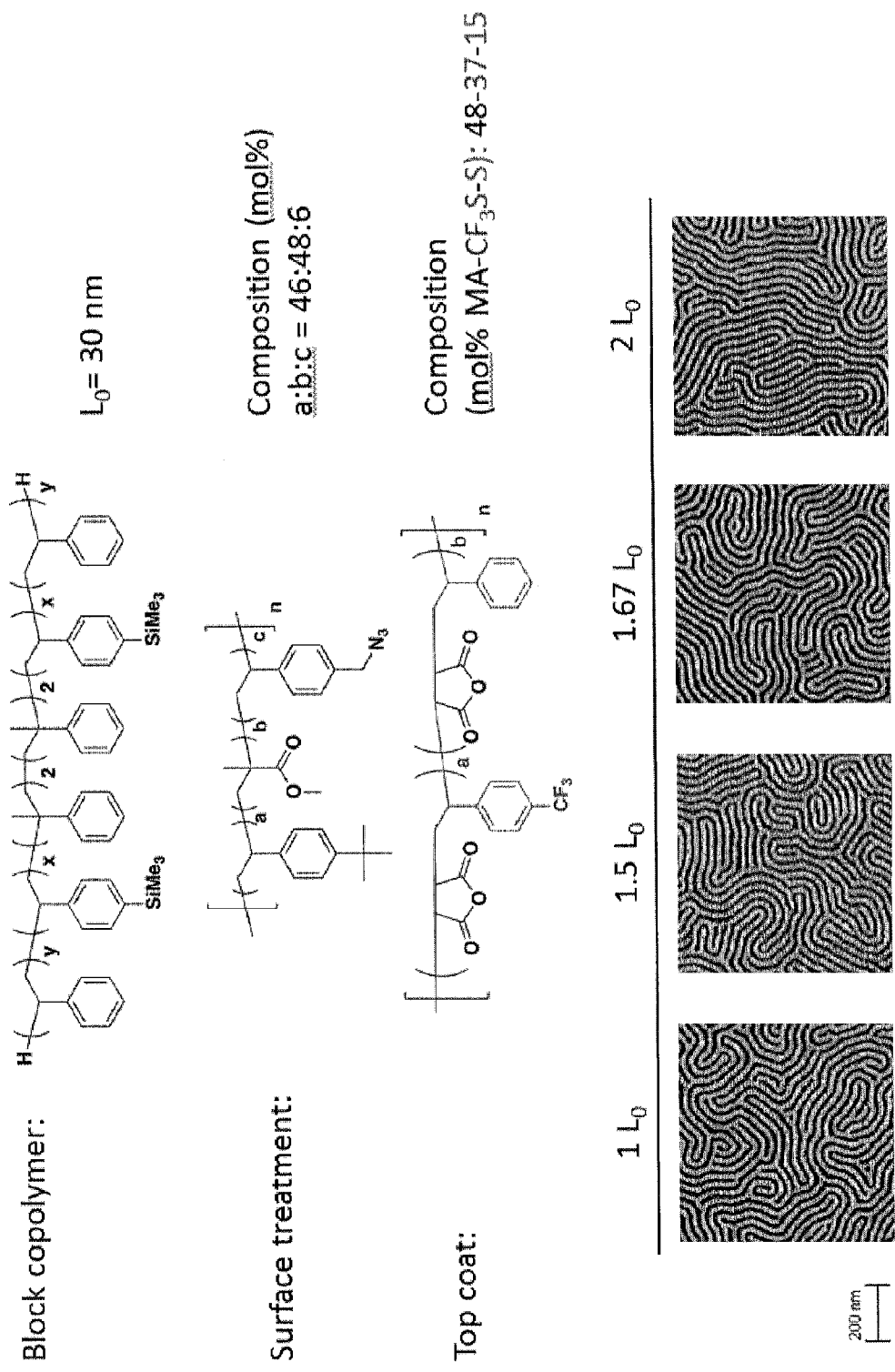
FIG. 5 provides the results of one embodiment including scanning electron micrographs of poly(styrene-block-4-trimethysilylstyrene-block-styrene) block copolymer films oriented with the top coat process. This block copolymer cannot be oriented by heating alone in the absence of the top coat.

Anhydride Copolymer Top Coats for Orientation Control of Thin Film Block Copolymers A 0.5 wt % solution of poly(4-tert-butylstyrene-co-methyl methacrylate-co-4-vinyl-benzylazide) in toluene was filtered with a 0.2 micron Chromafil® filter and spin coated at 3000 rpm for 30 sec to yield a smooth film ca. 15 nm. The film was heated at 250° C. on a hotplate for 5 minutes to crosslink and subsequently rinsed with toluene 3 times at 3000 rpm to remove uncrosslinked chains. The final film thickness after rinsing was ca. 14 nm as measured by ellipsometry. Various concentration solutions (1-2.5 wt %) of poly(styrene-block-4-trimethyl silylstyrene-block-styrene) in toluene were filtered with a 0.2 micron Chromafil® filter and cast onto the crosslinked substrate surface at various spin speeds to produce relatively smooth films with thicknesses ~30-60 nm ($1$-$2*L_0$). A 1 wt % solution of a top coat (see FIG. 5) in 3:1 (by mass) MeOH:aq. 30 wt % $NH_4OH$ solution was then spin-coated onto the BCP film at 3000 rpm. A 3:1 by mass solution of MeOH:aq. 30 wt % NH4OH was found to cause no change in the block copolymer film thickness as measured by ellipsometry. Samples were annealed on a Thermolyne HP-11515B hot plate at 190° C. for one minute. They were quickly removed and cooled to room temperature on a solid metal block. The top coat was stripped with 3:1 MeOH:aq. 30 wt % NH4OH solution. Stripped samples contained little (<=5 nm) residual top coat layer. The block copolymer film was etched with oxygen plasma etch the block copolymer with the following conditions: Pressure=20 mTorr, RF Power=10 W, ICP Power=50 W, $O_2$ flow rate=75 sccm, Argon flowrate=75 sccm, temperature=15° C., time=30 sec. See FIG. 5.

EXAMPLE 2

Figure 6:
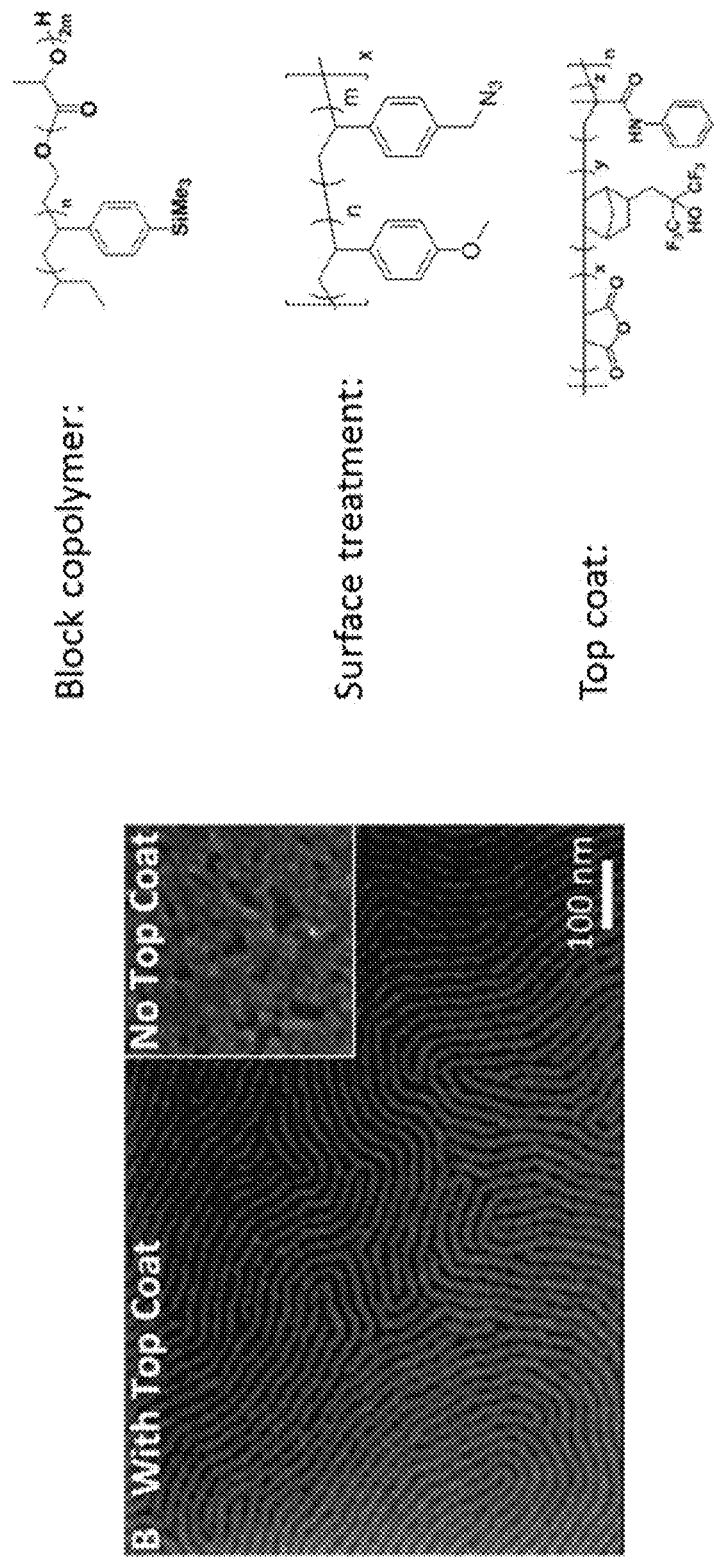
FIG. 6 provides representative results including a scanning electron micrograph of a poly(4-trimethylsilylstyrene-block-D,L-lactide) block copolymer film oriented with the top coat process.

A 0.5 wt % toluene solution of poly(4-methoxystyrene-co-4-vinylbenzylazide) (XST-OMe) was spin-coated at 3000 rpm for 30 sec onto a wafer that had been rinsed with acetone and isopropanol three times, respectively. The wafer was annealed at 250° C. for 5 min on a hot plate open to air to cross-link the film. Once removed from the hot plate and cooled to room temperature, the wafer was then submerged in toluene for 2 min and blown dry two times to remove uncrosslinked polymer. Typical film thicknesses were on the order of 13-15 nm, as determined by ellipsometry. A 1 wt % toluene solution of lamellar-forming poly(4-trimethylsilylstyrene-block-$_{D,L}$-lactide) was applied to crosslinked XST-OMe films. The top coat shown in FIG. 6 was then spin-coated out of a 30 wt % aq. $NH_4OH$ 60 nm (TC-PS). Methanol was used with the application of TC-PS to produce more uniform top coat thin films. A solution of 30 wt % aq. $NH_4OH$ was found to have no effect on the block copolymer film thickness as measured by ellipsometry. The trilayer film stack was subsequently annealed at 170° C. (for PTMSS-PLA, in a vacuum oven) for 20 h. Upon completion of annealing, the PTMSS-PLA sample annealed in the vacuum oven was cooled down to room temperature under vacuum over the course of ca. 5 h. The top coat was stripped with 30 wt % aq. NH4OH by spinning the wafer at 3000 rpm and applying 20 drops of stripping solution by pipette. In general, stripped films contained very little, if any detectable residual top coat (<4 nm) as measured by ellipsometry. Stripped samples were directly imaged without etching. See FIG. 6.

REFERENCES

1. Bates, F. S. and Fredrickson, G. H. (1990) "Block Copolymer Thermodynamics: Theory and Experiment," *Annu. Rev. Phys. Chem.* 41, 525-557.
2. Milner, S. T. (1991) "Polymer brushes," *Science* 251(4996), 905-914.
3. Zhao, B. and Brittain, W. J. (2000) "Polymer brushes: surface-immobilized macromolecules," *Prog. Polym. Sci.* 25(5), 677-710.

The invention claimed is:

1. A method, comprising:
   a. providing a substrate having a surface, a surface neutralization layer, a block copolymer, and a top coat;
   b. treating said substrate surface with said surface neutralization layer under conditions such that a first layer is created;
   c. coating said surface neutralization layer with block copolymer under conditions such that a second layer on said surface is created comprising a block copolymer film, and
   d. coating said block copolymer with a top coat so as to create a third layer on said surface, wherein said third layer controls the orientation of the block copolymer domains perpendicular to the plane of the film by thermal annealing alone.

2. The method of claim 1, wherein thermal annealing in the absence of the top coat layer does not produce perpendicular features.

3. The method of claim 1, wherein a top coat of step d) is in a solvent or solvent mixture that will not damage, dissolve, or substantially swell the block copolymer.

4. The method of claim 1, wherein the top coat of step d) is in a solvent that reacts with the top coat.

5. The method of claim 1, wherein the top coat of step d) is in a solvent mixture, and the solvent mixture contains a component that reacts with the top coat.

6. The method of claim 1, wherein the top coat is dissolved in a liquid comprised of at least one of the group consisting of water, alcohol, and organic solvent.

7. The method of claim 1, wherein the top coat is dissolved in a liquid comprised of a mixture of any two or more of the group consisting of water, alcohol and organic solvent.

8. The method of claim 7, wherein the liquid further contains a base.

9. The method of claim 7, wherein the liquid is a base.

10. The method of claim 8, wherein the base is an amine.

11. The method of claim 10, wherein said amine is selected from the group consisting of an alkyl amine, aliphatic amine and an amine attached to any combination of functional groups.

12. The method of claim 10, wherein said amine is a salt.

13. The method of claim 12, wherein said salt has a cation selected from the group consisting of an ammonium cation, an alkyl ammonium cation and an aliphatic ammonium cation.

14. The method of claim 12, wherein the salt comprises a combination of cations.

15. The method of claim 12, wherein said salt comprises an anion.

16. The method of claim 15, wherein said anion is an hydroxide anion.

17. The method of claim 8, wherein said base comprises ammonium hydroxide.

18. The method of claim 8, wherein said base comprises an alkyl ammonium hydroxide.

19. The method of claim 8, wherein said base comprises trimethylamine.

20. The method of claim 8, wherein said base comprises a mixture of a salt and an amine.

21. The method of claim 4, wherein the reacted top coat is re-isolated.

22. The method of claim 6, wherein the dissolved top coat is re-isolated.

23. The method of claim 22, wherein the re-isolated top coat is used to coat a block copolymer layer.

24. The method of claim 22, wherein the top coat is re-isolated by one or more techniques selected from the group consisting of precipitation, evaporation and distillation.

25. The method of claim 1, further comprising after step d) thermal annealing.

26. The method of claim 25, further comprising removing said top coat from said block copolymer with stripping solvent that does not damage, dissolve, or significantly swell the block copolymer.

27. The method of claim 3, wherein said top coat comprises an anhydride.

28. The method of claim 27, wherein the anhydride derives from maleic anhydride.

29. The method of claim 1, wherein the substrate is selected from the group consisting of silicon, silicon oxide, glass, surface-modified glass, plastic, ceramic, transparent substrates, flexible substrates, and substrates used in roll-to-roll processing.

30. The method of claim 1, wherein said block copolymer is comprised of plurality of different blocks.

31. The method of claim 30, wherein the block copolymer comprises at least one block that etches at a different rate than the other block(s).

32. The method of claim 30, wherein the block copolymer comprises silicon in at least one block.

33. The method of claim 30, wherein the block copolymer is poly(styrene-block-4-trimethylsilylstyrene-block-styrene).

34. The method of claim 30, wherein the block copolymer is poly(4-trimethylsilylstyrene-block-$_{D,L}$-lactide).

35. The method of claim 30, wherein the block copolymer comprises tin in at least one block.

36. The method of claim 30, wherein the block copolymer comprises an inorganic component.

37. The method of claim 30, wherein the block copolymer comprises an organometallic component.

38. The method of claim 25, wherein said thermal annealing creates block copolymer domains perpendicular to the plane of the film.

39. The method of claim 38, wherein the morphology of the domains is selected from the group consisting of lamellar, spherical, and cylindrical.

40. The method of claim 25, wherein said thermal annealing is performed under conditions selected from the group consisting of an air environment, an environment of inert gas, reduced pressure, and increased pressure.

41. The method of claim 2, wherein said surface neutralization layer comprises components selected from the group consisting of cross-linked polymer, brushes, self-assembled monolayers, chemically modified surfaces, physically modified surfaces, and thermally cured surfaces.

42. A method, comprising:
   a) providing a substrate having a surface, a surface neutralization layer, a block copolymer, and a top coat;
   b) treating said substrate surface with said surface neutralization layer under conditions such that a first layer is created;
   c) coating said surface neutralization layer with block copolymer under conditions such that a second layer on said surface is created comprising a block copolymer film; and
   d) coating said block copolymer with a top coat so as to create a third layer on said surface;
   e) treating said third layer under conditions which controls the orientation of block copolymer features perpendicular to the plane of the film.

43. The method of claim 42, wherein said treating of step e) comprises thermal annealing.

44. The method of claim 43, wherein thermal annealing in the absence of the top coat layer does not produce perpendicular features.

45. The method of claim 42, wherein said top coat is dissolved in trimethylamine.

46. The method of claim 42, wherein said coating comprises spin coating.

* * * * *